United States Patent [19]

Kojima

[11] Patent Number: 5,316,963
[45] Date of Patent: May 31, 1994

[54] METHOD FOR PRODUCING SEMICONDUCTOR DEVICE

[75] Inventor: Mitsuo Kojima, Kyoto, Japan

[73] Assignee: Rohm Co., Ltd., Kyoto, Japan

[21] Appl. No.: 36,726

[22] Filed: Mar. 25, 1993

[30] Foreign Application Priority Data

Apr. 28, 1992 [JP] Japan .................. 4-110049

[51] Int. Cl.⁵ .......................................... H01L 21/70
[52] U.S. Cl. ........................................ 437/52; 437/43; 437/45; 437/48
[58] Field of Search .................. 437/43, 45, 48, 52; 257/321

[56] References Cited

U.S. PATENT DOCUMENTS

| | | | |
|---|---|---|---|
| 4,830,974 | 5/1989 | Chang et al. | 437/43 |
| 4,851,361 | 7/1989 | Schumann et al. | 437/43 |
| 5,081,052 | 7/1992 | Kobayashi et al. | 437/45 |
| 5,227,326 | 7/1993 | Walker et al. | 437/43 |

Primary Examiner—Tom Thomas
Attorney, Agent, or Firm—Nikaido, Marmelstein, Murray & Oram

[57] ABSTRACT

A method for producing a semiconductor device, composed of manufacturing a semiconductor device having an arrayed read only memory arranged in an array with a production line used for manufacturing a semiconductor device having a flash memory which determines a state to be written in the read only memory with use of at least a semiconductor device having the flash memory.

3 Claims, 6 Drawing Sheets

METHOD FOR PRODUCING SEMICONDUCTOR DEVICE

FIELD OF THE INVENTION

The present invention relates to a method for producing a semiconductor device, and more particularly, to a method for producing a semiconductor device comprising a read only memory (referred to as "ROM", hereinbelow).

BACKGROUND OF THE INVENTION

In a conventional method for producing a ROM semiconductor device having memory cells arranged in an array, in order to determine programming or state of "1" or "0" in each of the memory cells arranged in an array in accordance with a desired purpose for use, a flash memory capable of writing data therein and reading it out therefrom is firstly formed, then "1" or "0" is written in each memory cell a user side to verify whether the program works as expected, and the program to be written in the ROM is finally determined. Then, the ROM has "1" or "0" written in each memory cell by changing an impurity concentration of a channel region, so that a ROM semiconductor device is produced.

Since the semiconductor device having the ROM is different from a semiconductor device having a flash memory in the structure of the memory part, in general they are manufactured with different production lines and each mask is separately manufactured, and each condition for the respective devices is separately set.

However, other semiconductor elements such as a sense amplifier included in the semiconductor device having a flash memory for determining an optimized state ("1" or "0") to be written in the ROM are the same as those included in the semiconductor device having the ROM of which the state is finally determined. The separate production lines similar to each other lead to a mistake of production conditions and hinders effective operations of production equipment.

In addition, separate masks for individual use are formed for formation of corresponding elements of the semiconductor device having a flash memory and the semiconductor device having the ROM identical therewith, resulting in an increase in the cost for mask, hence for the production of the semiconductor device.

SUMMARY OF THE INVENTION

In view of the above-mentioned problems, it is an object of the present invention to provide a method for producing a semiconductor device, wherein a production line for a semiconductor device having a ROM is unified with that for a semiconductor device having a flash memory with sharing masks so as to improve the productivity with a decreased production cost.

According to the present invention, there is provided a method for producing a semiconductor device, comprising manufacturing a semiconductor device, having an arrayed read only memory arranged in an array, with a production line used for manufacturing a semiconductor device having a flash memory using at least half of the masks used for the manufacturing of the semiconductor device having the flash memory.

It is preferable that a well, a LOCOS, a mask for forming a channel stop region used for implanting ion, n+-type source and drain regions, p+-type source and drain regions, a contact hole, an electrode film and an electrode pad are formed by using masks for producing a flash memory.

It is preferable that a mask used for high threshold voltage, a mask for allowing ion implantation to a n-channel in a peripheral element at the same time, a mask for forming a gate electrode and a mask for forming a LDD in a source and drain region of a memory cell are respectively independent of the masks used for producing a flash memory.

In the present invention a semiconductor device having a ROM is manufactured with a production line for a semiconductor device having a flash memory, with sharing most of the production conditions and masks. Accordingly, only a partial alteration of the production process makes it possible to manufacture a semiconductor device having a ROM with few problems in production while greatly improving the productivity.

DETAILED DESCRIPTION

Now, a method for producing a semiconductor device having a ROM according to the present invention will be described with reference to the drawings showing the structure of a CMOS semiconductor device having a NMOS part forming a ROM cell and a peripheral PMOS part forming a peripheral transistor will be compared with a production process for a semiconductor device having a flash memory (hereinafter referred to as "flash memory IC").

Figure 1:
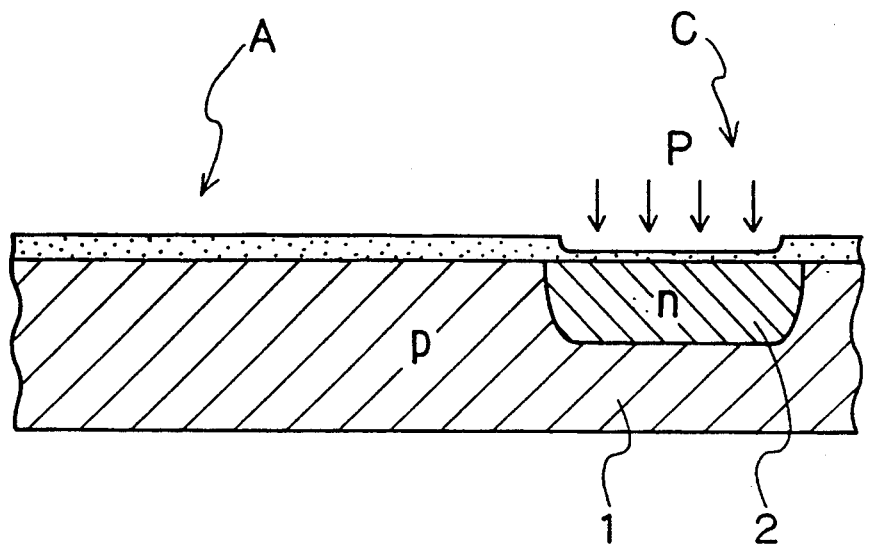
FIGS. 1 to 11 are each a schematic section for illustrating a step of a production process for a semiconductor device having a ROM according to an example of the present invention.

Referring to FIG. 1, a well 2 for PMOS is formed in a peripheral part C adjacent a cell part A, which are included in a semiconductor substrate 1. Practically, phosphorus ions were implanted in a p-type semiconductor substrate 1 to form an n-type well 2. A well identical with the well 2 formed for the flash memory IC. Accordingly, both the PMOS process and the flash memory IC process can be performed by using the same mask (mask No. 1 in Table 1) and the same formation conditions.

Figure 2:
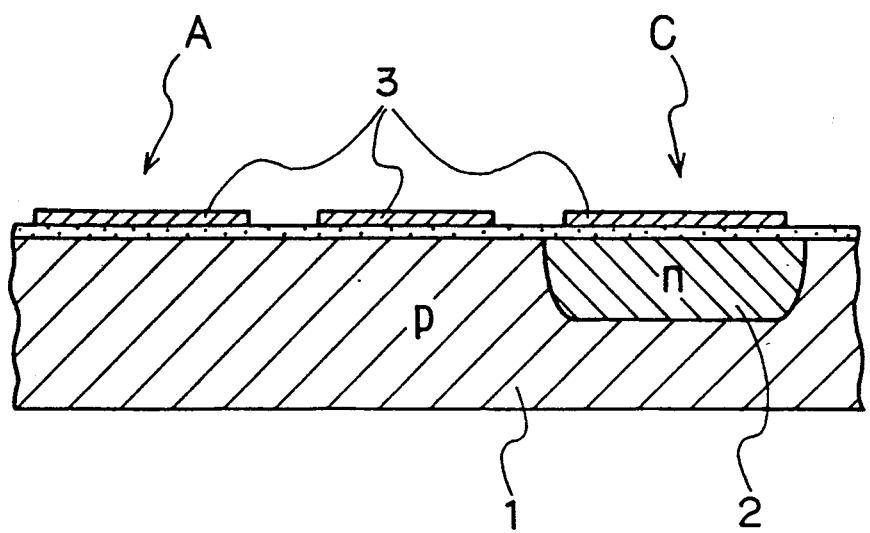

Referring to FIG. 2, next an oxidation-resistant film 3 is formed in regions other than a LOCOS formation region in preparation for forming a LOCOS film 5 for device isolation. Practically, an oxidation-resistant film 3, for example, made of a film nitride was formed on the surface of the semiconductor substrate 1, then the oxidation-resistant film 3 located only in a LOCOS formation region was removed with use of a mask for LOCOS. A LOCOS film identical with the LOCOS film 5 also is formed for manufacturing the flash memory IC; accordingly, both processes can be performed through the same mask for LOCOS (mask No. 2 in Table 1) and the same formation conditions.

Figure 3:
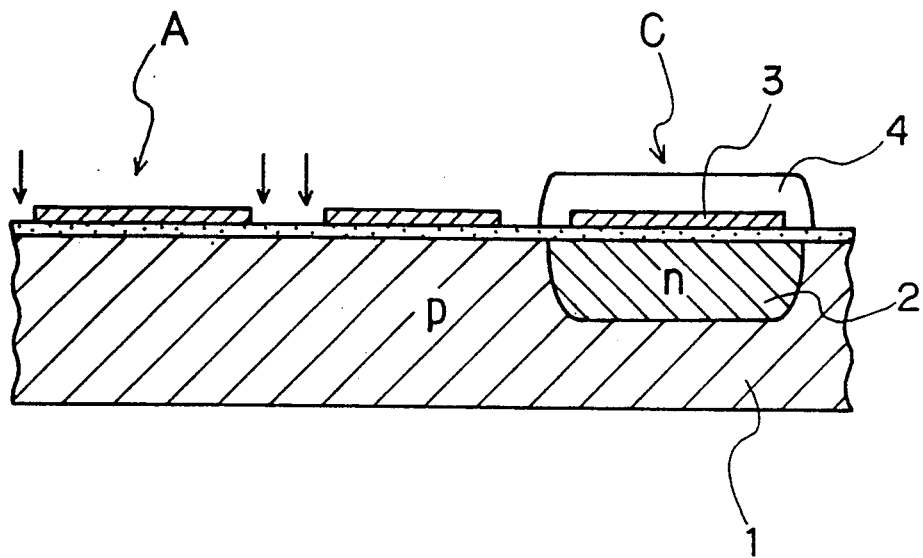

Referring to FIG. 3, ion implantation is in turn carried out to form a channel stop region under the LOCOS film to be formed in the cell part A. Practically, boron ions were implanted in a dose of $7 \times 10^{13}$ ions/cm$^2$ with the peripheral part C masked with a resist film 4. A mask for forming a channel stop region identical with the mask used for forming the pattern of the resist film 4 also is formed for manufacturing the flash memory IC; accordingly, the two processes can be performed through the same mask for the channel stop formation (mask No. 3 in Table 3).

Figure 4:
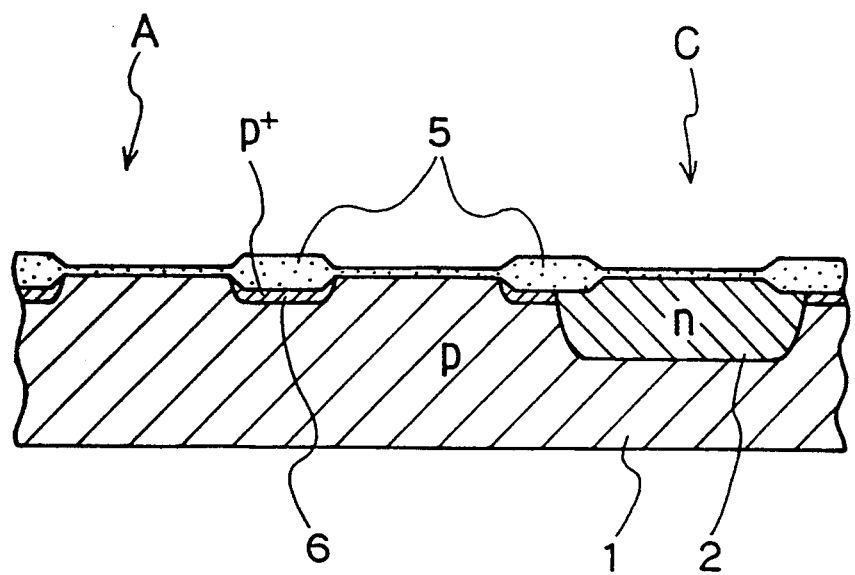

Referring to FIG. 4, after removing the resist film 4, a heat treatment was carried out at about 1000° C. for about 300 minutes to form the LOCOS film 5 and a p+-type channel stop region 6.

An ion implantation is carried out with masking regions other than the cell part A with a resist film 12 to write the state of "0" or "1" in the cell part. When a state of "1" is to be written, the cell part A is doped with ions relatively lightly to lower the threshold voltage thereof, while when a state of "0" is to be written, the cell part A is doped with ion relatively heavily to raise the threshold voltage thereof. In this case, two kinds of masks (mask Nos. 7 and 8 in Table 1) for the heavy doping and for allowing ion implantation to a n-channel (not shown) in a peripheral element are used at the same time. Although one of the two masks is equivalent to that used for the threshold voltage of a n-channel transistor in the flash memory IC, they are different from each other in structure. Hence, that mask needs to be originally fabricated for individual use. The other mask is a novel and original mask which is not used in the flash memory IC process.

In the flash memory IC process there are three steps comprising an ion implantation step for determining the threshold voltage of cells, a floating gate forming step, and an array protect step for removing a film oxide present on regions other than the floating gate, with use of respective masks (mask Nos. 4 to 6 in Table 1) prior to the above step in the CMOS process. These three steps are omitted in the CMOS process.

Figure 5:
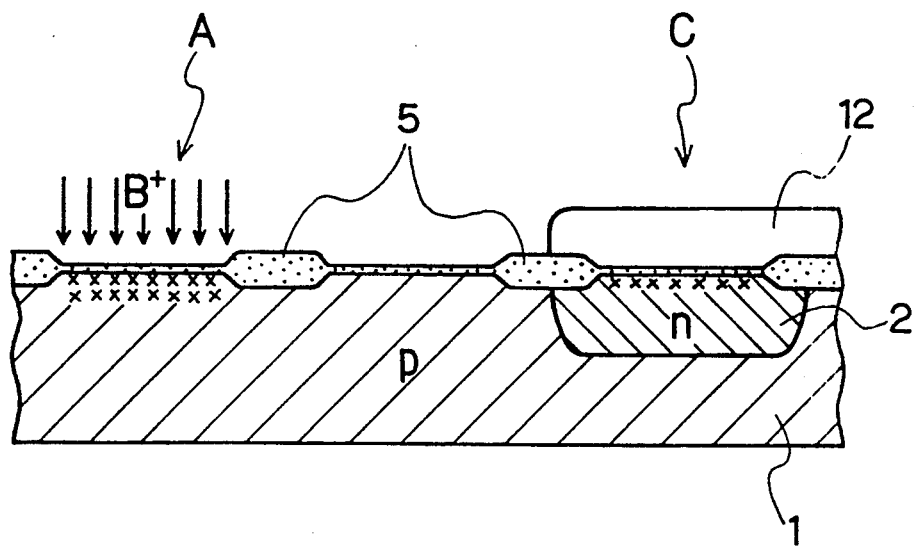
Figure 6:
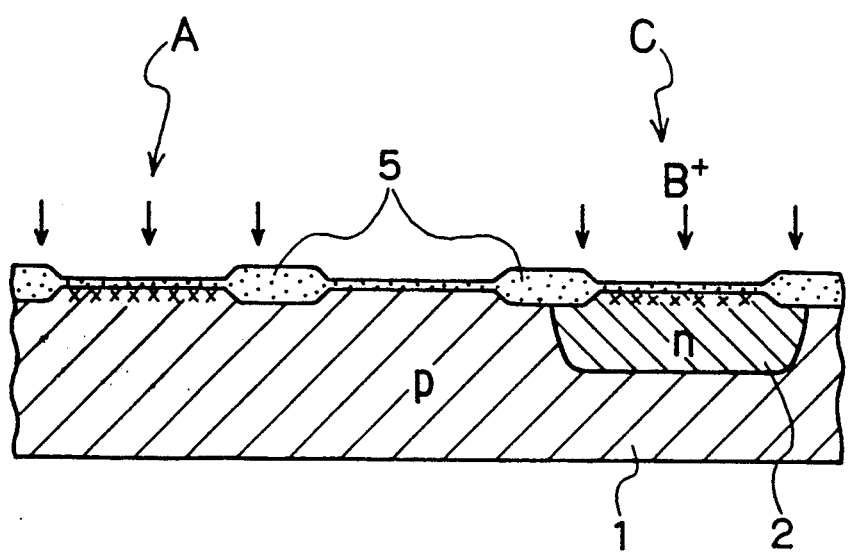

Practically, writing a state of "0" or "1" was carried out as follows. To write a state of "1", boron ions were implanted in a cell in an dose of, for example, $3 \times 10^{12}$ ions/cm$^2$ so as to set the impurity concentration of the cell to $1 \times 10^{17}$ ions/cm$^3$, while to write a state of "0" boron ions were implanted in a cell in an dose of, for example, $5 \times 10^{13}$ ions/cm$^2$ so as to set the impurity concentration of the cell to $1.7 \times 10^{17}$ ions/cm$^3$ (refer to FIG. 5). Subsequently, boron ions were further implanted without using a mask on the whole substrate surface so as to adjust the threshold voltage of the p-channel transistor in the peripheral part C (refer to FIG. 6). In this case, although the cell part A was exposed to ion implantation, the amount of ions precedingly implanted for adjusting the threshold voltage of the cell part A was set less than the desired amount of ions for adjusting the threshold voltage of the p-channel transistor. Thus, there is no effect on the storage of data.

Figure 7:
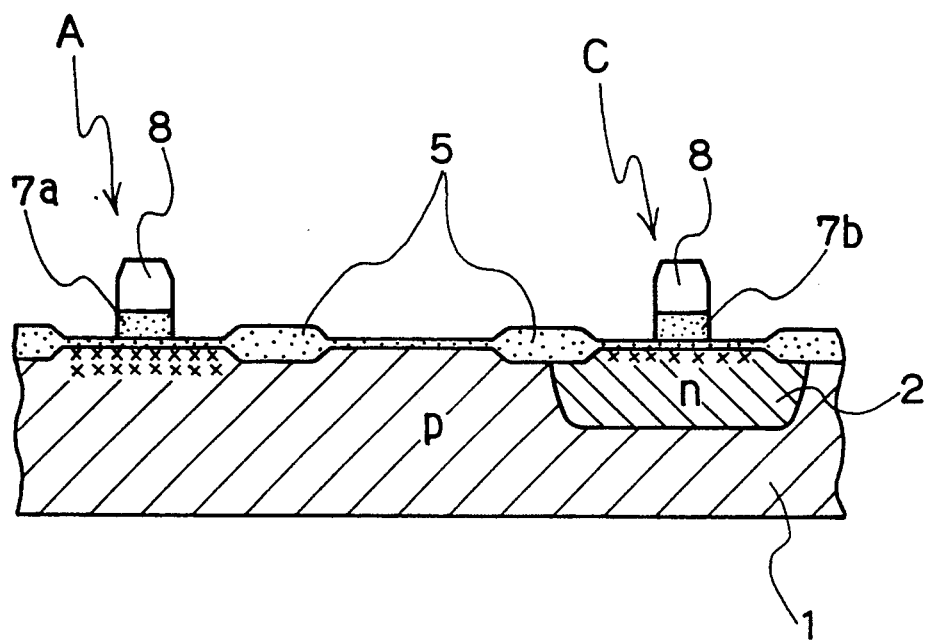

Next, gate electrodes 7a and 7b are formed. Although this step is equivalent to a second gate electrode (control gate electrode) formation step in the flash memory IC process, it is carried out with an individual mask (mask No. 9 in Table 1) and conditions because of the difference in shape. Practically, a polysilicon film was deposited to about 0.5 μm thick by CVD, then masked with a resist film 8 and etched to form the gate electrodes 7a and 7b (referring to FIG. 7).

Figure 8:
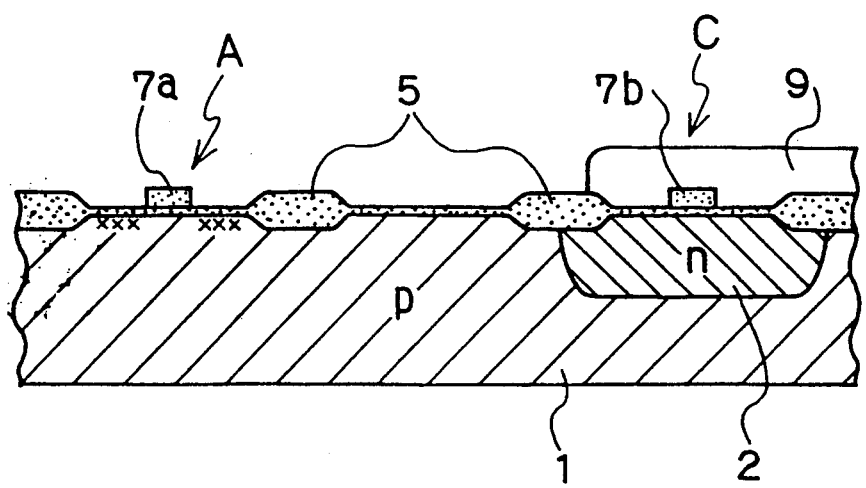
Figure 9:
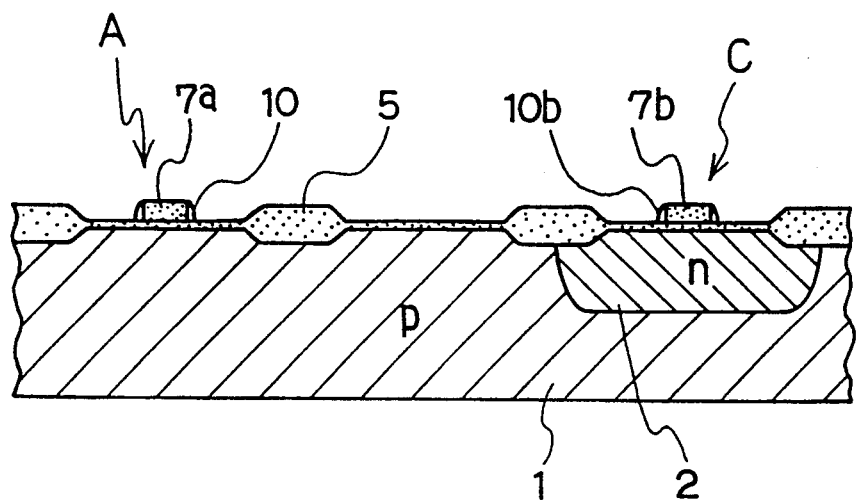
Figure 10:
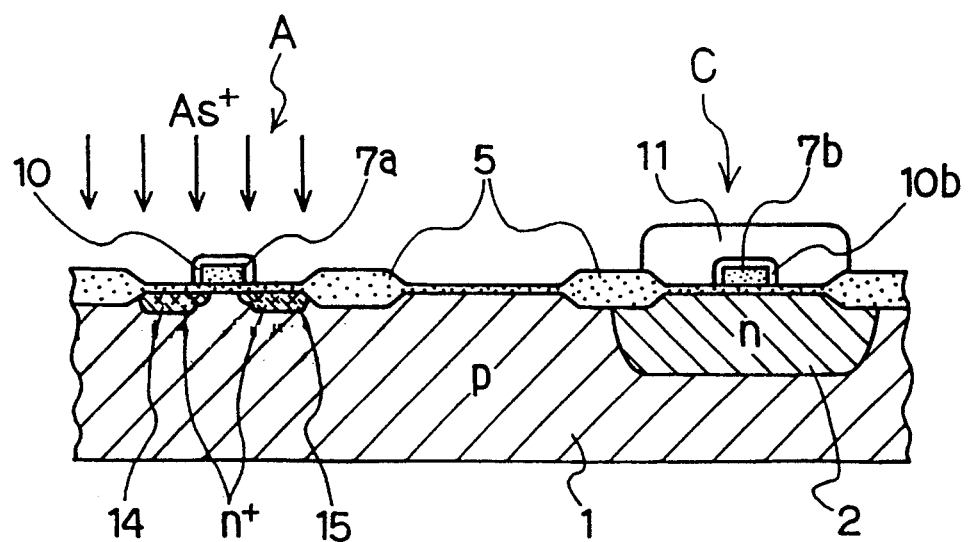
Figure 11:
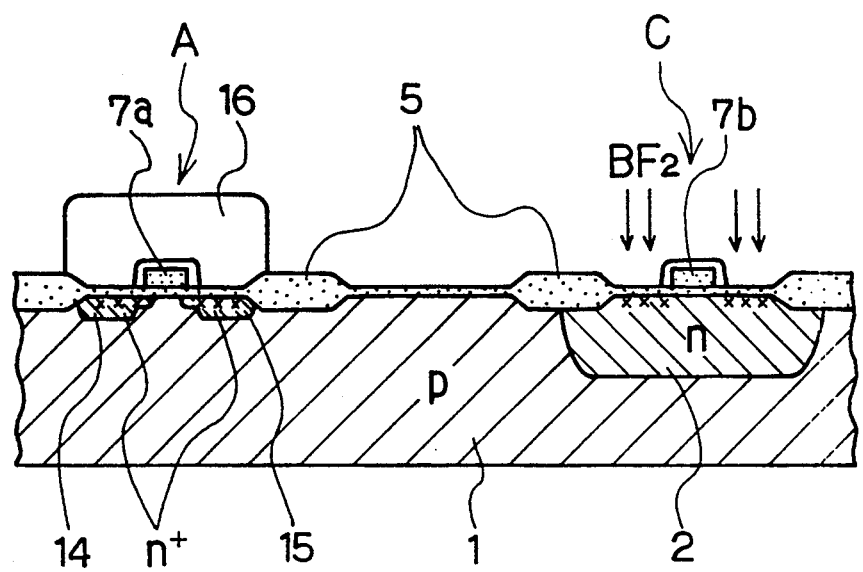

An ion implantation for forming a lightly doped drain structure (hereinafter referred to as "LDD") is carried out only on the NMOS in the cell part A with masking the PMOS in the peripheral part C with a resist film 9 (see FIG. 8). This implantation enables formation of a lightly doped region in the drain region so as to improve the dielectric strength of the transistor. Although this step is equivalent to a LDD formation step by implanting ions to a peripheral transistor of the flash memory IC, a mask (mask No. 10) exclusive to this step is used because a peripheral NMOS (not shown) is made to have a LDD in the same shape as that formed in the ROM though the cell part of the flash memory IC is not of a LDD. Practically, phosphorus ions were implanted in a dose of $3 \times 10^{13}$ ions/cm$^2$ with masking the PMOS in the peripheral part C. Subsequently, a side wall film, for example, made of SiO$_2$ was formed by CVD wherein tetra ethoxy silane was introduced, then etched back by RIE to form a side wall 10 (see FIG. 9).

Next, n+-type source and drain regions 12 and 13 are formed for the NMOS in the cell part A. Since the transistor in this CMOS is formed in the same manner as in the flash memory IC, a common mask (mask No. 13) is shared by the CMOS process and the flash memory IC process. Practically, arsenic ions were implanted in the NMOS with other regions masked with a resist film 11 in a dose of $3.5 \times 10^{15}$ ions/cm$^2$ so as to set the impurity concentration to about $1 \times 10^{19}$ ions/cm$^3$, and to anneal at about 850° C. for about 20 minutes. In the flash memory IC process there are steps, comprising a cell gate formation step wherein a polysilicon film is etched and an ion implantation step for formation of n+-type high concentration region in the cell part for enhancing the dielectric strength thereof, with use of respective masks (mask Nos. 11 and 12) prior to this step. These two steps are omitted in the CMOS process.

Next, p+-type source and drain regions 14 and 15 for the PMOS are formed in the peripheral part C. Since the transistor formed in the CMOS is formed in the same manner as in the flash memory IC, this step is carried out using a common mask (mask No. 14 in Table 1) under common conditions. Practically, BF$_2$ ions were implanted in such a manner as in the case of the NMOS, in the CMOS, in the PMOS with other regions masked with a resist film 16 in a dose of $2.5 \times 10^{15}$ ions/cm$^2$ so as to set the impurity concentration to about $1 \times 10^{19}$ ions/cm$^3$, and to anneal at about 850° C. for about 20 minutes.

Figure 12:
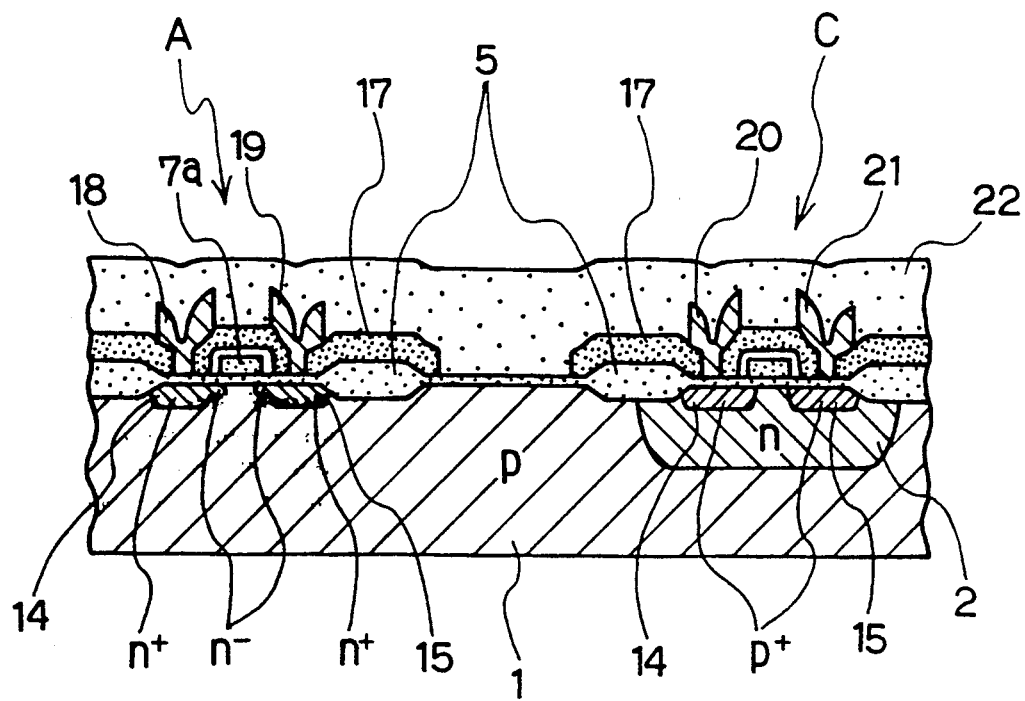
FIGS. 12 is a schematic section for illustrating the final step of the production process for a semiconductor device having a ROM according to an embodiment of the present invention.

Referring to FIG. 12, finally a contact hole is formed by etching a protective film 17 located on an electrode formation region, and an electrode film and an electrode pad is formed. This step is carried out with masks (mask No. 15 to 17 in Table 1) and conditions common to the two processes, for formation of the contact hole, patterning of the Al electrode film and formation of the electrode pad, respectively.

Practically, a phosphosilicate glass (PSG) film was deposited on the substrate surface, then coated with a resist film. The PSG film present in a contact hole formation region was etched with use of a mask to form a contact hole. Subsequently, an Al-Si alloy film was deposited on the whole substrate surface by, for example, sputtering and then patterned to form electrode films 18 to 21. Further, a protective film 22 was formed, then covered with a resist film and patterned to form electrode pads (not shown).

Table 1 shows the relationship between the flash memory IC process and the CMOS process with focusing on the masks used.

As can be understood from Table 1, eight of the twelve masks used in the CMOS process are shared with the flash memory IC process, five steps of the flash memory IC process are omitted, and separate masks are used in four steps so as to produce the devices using the same production line.

As has been described, according to the present invention a semiconductor device having a ROM can be produced sharing a production line for a semiconductor device having a flash memory which functions to determine state of the former. Accordingly, production conditions for the two processes are substantially unified with production operations simplified. This leads to improvement in productivity and yield. Besides, sharing of most of the masks makes it possible to greatly reduce the cost for the mask. As a result, the period needed for production of an intended device can be largely shortened, while at the same time the production cost is greatly lowered. Thus, a low-price semiconductor device can be obtained.

Though several embodiments of the present invention are described above, it is to be understood that the present invention is not limited only to the above-mentioned and various changes and modifications may be made in the invention without departing from the spirit and scope thereof.

TABLE 1

| No. | Flash Memory IC PROCESS | CMOS PROCESS |
| --- | --- | --- |
| 1 | Well | Shared |
| 2 | LOCOS | Shared |
| 3 | Channel Stop Region | Shared |
| 4 | Cell VT | Omitted |
| 5 | Gate 1 | Omitted |
| 6 | Array Protect | Omitted |
| 7 | n-Channel VT | Individual |
| 8 | | Individual |
| 9 | Gate 2 | Individual |
| 10 | LDD | Individual |
| 11 | Cell Gate | Omitted |
| 12 | $n^+$-Cell | Omitted |
| 13 | $n^+$-Source/Drain | Omitted |
| 14 | $p^+$-Source/Drain | Shared |
| 15 | Contact | Shared |
| 16 | Electrode Film | Shared |
| 17 | Pad | Shared |

What is claimed is:

1. A method for producing a semiconductor read only memory device having read only memory (ROM) cells and peripheral CMOS transistors, wherein a memory state for each of the read only memory cells is determined using a semiconductor device having flash memory cells and peripheral CMOS transistors, the method comprising the steps of:
(a) forming a well in a semiconductor substrate for each peripheral transistor formation portion;
(b) forming an oxide film for device isolation;
(c) forming a channel stop region;
(d) performing ion implantation to ROM cell portions for low-threshold voltage adjustment;
(e) performing ion implantation to the ROM cell portions for high-threshold voltage adjustment;
(f) forming a gate electrode in each of the ROM cell portions and in each of the peripheral transistor formation portions;
(g) performing ion implantation using the gate electrode as a mask to form a lightly-doped drain;
(h) forming side walls on the gate electrode of each of transistors, and forming a source region and a drain region for each of p-channel transistors and of n-channel transistors;
(i) forming a contact hole extending through an insulating film covering each of the source and drain regions; and
(j) providing an electrode film to the contact hole,
wherein a major part of the steps utilizing masks used for manufacturing the semiconductor device having flash memory cells are used in common for manufacturing the semiconductor device having read only memory cells.

2. The method of claim 1, wherein the steps (a), (b), (c), (h), (i) and (j) use the masks used for manufacturing the semiconductor device having flash memory cells.

3. The method of claim 1, wherein the steps (d), (e), (f) and (g) use original masks which are different from masks used for manufacturing the semiconductor device having flash memory cells.

* * * * *